United States Patent
Rose

(10) Patent No.: US 6,627,558 B2
(45) Date of Patent: Sep. 30, 2003

(54) APPARATUS AND METHOD FOR SELECTIVELY RESTRICTING PROCESS FLUID FLOW IN SEMICONDUCTOR PROCESSING

(75) Inventor: David Jay Rose, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/121,109

(22) Filed: Apr. 10, 2002

(65) Prior Publication Data

US 2002/0108565 A1 Aug. 15, 2002

Related U.S. Application Data

(62) Division of application No. 09/732,341, filed on Dec. 7, 2000, now Pat. No. 6,395,640, which is a division of application No. 09/096,012, filed on Jun. 10, 1998, now Pat. No. 6,373,088.
(60) Provisional application No. 60/172,428, filed on Dec. 17, 1999.

(51) Int. Cl.$^7$ .............................................. H01L 21/302
(52) U.S. Cl. ..................................................... 438/747
(58) Field of Search ................................. 118/679, 693, 118/416, 720, 728–731, 624, 681, 206, 210, 232, 233; 427/484, 425; 216/90, 92; 438/694, 745–748, 758

(56) References Cited

U.S. PATENT DOCUMENTS

| | | | |
|---|---|---|---|
| 4,340,462 A | 7/1982 | Koch | 204/298 |
| 5,091,217 A * | 2/1992 | Hey et al. | 427/248.1 |
| 5,252,178 A | 10/1993 | Moslehi | 156/643 |
| 5,286,297 A | 2/1994 | Moslehi et al. | 118/723 E |
| 5,453,124 A | 9/1995 | Moslehi et al. | 118/715 |
| 5,464,499 A | 11/1995 | Moslehi et al. | 216/71 |
| 5,624,498 A | 4/1997 | Lee et al. | 118/715 |
| 5,865,984 A * | 2/1999 | Corbin, Jr. et al. | 205/670 |
| 5,950,925 A | 9/1999 | Fukunaga et al. | 239/132.3 |
| 6,173,673 B1 | 1/2001 | Golovato et al. | 118/723 E |
| 6,206,972 B1 | 3/2001 | Dunham | 118/715 |
| 6,303,045 B1 * | 10/2001 | Bullock | 216/71 |

* cited by examiner

*Primary Examiner*—Matthew Smith
*Assistant Examiner*—Calvin Lee
(74) *Attorney, Agent, or Firm*—Yingsheng Tung; Wade James Brady, III; Frederick J. Telecky, Jr.

(57) ABSTRACT

A semiconductor processing apparatus (10) is disclosed which includes a process chamber (12) and at least one substrate support (18) disposed within the process chamber (12) operable to support a substrate wafer (20). The semiconductor processing apparatus includes at least one showerhead assembly (14) disposed within the process chamber (12) facing the substrate support (18) and has a showerhead plate (16). The showerhead plate (16) has a plurality of passageways (17) extending therethrough for directing process fluid toward a substrate wafer (20) disposed on the substrate support (18). A blocking assembly (21) is disposed within the process chamber (12), the blocking assembly has an active position (32) between the showerhead assembly (14) and the substrate support (18) to restrict the flow of process fluid between the showerhead assembly (14) and the substrate support (18). The blocking assembly also has a neutral position (30) that does not restrict the flow of process fluid between the showerhead assembly (14) and the substrate support (18).

7 Claims, 1 Drawing Sheet

APPARATUS AND METHOD FOR SELECTIVELY RESTRICTING PROCESS FLUID FLOW IN SEMICONDUCTOR PROCESSING

This is a divisional application of Ser. No. 09/732,341 filed Dec. 7, 2000 now U.S. Pat. No. 6,395,640 which is a divisional appl. Ser. No. 09/096,012, filed Jun. 10, 1998, now U.S. Pat. No. 6,373,088 and a non-provisional application of provisional application No. 60/172,428 filed Dec. 17, 1999.

TECHNICAL FIELD OF THE INVENTION

This invention relates in general to the field of electronic devices. More specifically, this invention relates to an apparatus and method for restricting process fluid flow during semiconductor processing.

BACKGROUND OF THE INVENTION

Semiconductor fabrication typically includes depositing material onto a semiconductor substrate wafer and etching material from the substrate. Often these processes take place within a process chamber containing one or more wafers and a deposition apparatus referred to as a showerhead. The showerhead acts to direct process fluid to the semiconductor substrate wafer. The showerhead typically includes an inlet conduit connected to a process fluid source outside of the process chamber and a showerhead plate with a number of holes extending therethrough to direct process fluid exiting the showerhead to the semiconductor substrate wafer. Showerheads are also used in both material deposition and etching processes to direct deposition and etching fluid to the semiconductor substrate wafer.

Problematic edge effects often result from uneven deposition and etch across the radius of a semiconductor substrate wafer. These problems often result when the characteristics of a plasma field or the flow of process fluid varies between the center of the wafer and the edge of the wafer. Such nonuniform deposition and etch often results in a semiconductor substrate wafer with disparate electrical properties across its radius. Because of this disparity portions of the wafer are often not usable for their intended function. In the case of circular wafers, inadequate deposition and etching of material adjacent to the outer edge of the wafer often renders devices formed adjacent to the outer edge of the wafer defective. As wafer diameter increases from six inches-to eight inches-to twelve inches, the number of devices formed adjacent to the outer edge increases significantly. Therefore, edge defects for a twelve inch wafer result in a greater number of unusable devices as compared with a six inch wafer.

One past solution for controlling deposition and etch across the radius of a wafer was to alter the geometry of holes extending through a showerhead plate. This technique allows process fluid to be directed toward selected areas of the substrate wafer. Simply, to increase process fluid flow to selected areas, more or larger holes are formed in the showerhead plate opposite those areas. However, this solution suffers from a number of drawbacks. First, a specialized showerhead plate is typically formed for a particular process and is often not useful for other processes. Second, experimentation with a specialized showerhead plate is time consuming and expensive. A complete processing run is often required to evaluate the effectiveness of a particular geometry of holes in a showerhead plate. This consumes valuable resources and processing time. Third, the use of specialized showerhead plates for each deposition and etch process step can be costly, often requiring multiple showerhead assemblies to perform multiple processing steps and replacing showerhead assemblies to accomplish process changes.

SUMMARY OF THE INVENTION

Therefore, a need has arisen for an apparatus that can selectively control deposition and etching on the outer edge of a semiconductor substrate wafer.

A further need has arisen for an apparatus that can selectively control the deposition and etching of material across the radius of a semiconductor substrate wafer.

A further need has arisen for an apparatus that is operable to selectively vary deposition and etch edge effects in a plurality of processes.

In accordance with teachings of the present invention, an apparatus and method are described which substantially eliminates or reduces disadvantages and problems associated with prior apparatuses and methods used to deposit and etch materials during semiconductor fabrication. The apparatus includes a process chamber and a blocking assembly disposed within the process chamber. The blocking assembly may be selectively positioned in an active or neutral position. When positioned in the active position, the blocking assembly restricts process fluid flow directed toward a substrate wafer from a showerhead assembly disposed in the process chamber. When positioned in the neutral position the blocking assembly does not restrict the flow of process fluid between the showerhead assembly and the substrate wafer.

In one aspect of the present invention a semiconductor processing apparatus is disclosed. The semiconductor processing apparatus includes a process chamber and at least one substrate support disposed within the process chamber operable to support a substrate wafer. The semiconductor processing apparatus also includes at least one showerhead assembly disposed within the process chamber that faces the substrate support and has a showerhead plate. The showerhead plate has a plurality of passageways extending therethrough for directing a process fluid toward a substrate wafer disposed on the substrate support. A blocking assembly is disposed within the process chamber. The blocking assembly has an active position between the showerhead assembly and the substrate support to restrict the flow of process fluid between the showerhead assembly and the substrate support. The blocking assembly also has a neutral position that does not restrict the flow of process fluid between the showerhead and the substrate support. More specifically, the blocking assembly includes at least one blocking disk that has an outer diameter smaller than the outer diameter of the substrate wafer. Also, the at least one blocking disk is selectively movable between the active position and the neutral position.

In another aspect of the present invention a process fluid blocking assembly for controlling the flow of a process fluid in a semiconductor processing apparatus is disclosed. The process fluid blocking assembly includes a rotator selectively rotatable and at least one blocking disk having a substantially circular configuration. The blocking assembly also includes a linkage having a first end and a second end. The first end of the linkage is coupled to the rotator and the second end is coupled to the at least one blocking disk such that the blocking disk rotates as the rotator rotates. More specifically, the process fluid blocking assembly includes a plurality of blocking disks having multiple disk sizes where the plurality of blocking disks is operable to releasably couple to the linkage.

In another aspect of the present invention, a method for fabricating a semiconductor device on a substrate wafer disposed in a semiconductor fabrication apparatus is disclosed. The method includes supplying process fluid to a showerhead assembly positioned opposite the substrate wafer. The method also includes selectively positioning a blocking assembly between the showerhead assembly and the substrate wafer to restrict the flow of process fluid from the showerhead to the substrate wafer. This selective positioning of the blocking assembly affects the fabrication of the semiconductor device.

The present invention provides a number of important technical advantages. One technical advantage is having at least one blocking disk that has an outer diameter smaller than the outer diameter of the substrate wafer. This allows the deposition apparatus to selectively control deposition on the outer edge of the substrate wafer.

Another technical advantage of the present invention is having a blocking assembly with an active position and a neutral position. This allows the deposition apparatus to selectively control the deposition and etching of material across the radius of a substrate wafer.

Another technical advantage of the present invention is having a plurality of blocking disks having multiple disk sizes, operable to releasably couple to the linkage. This allows the blocking assembly to selectively vary deposition and etch edge effects in a plurality of processes.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments and their advantages are best understood by reference to FIGS. 1 through 4, wherein like numbers are used to indicate like and corresponding parts.

Figure 1:
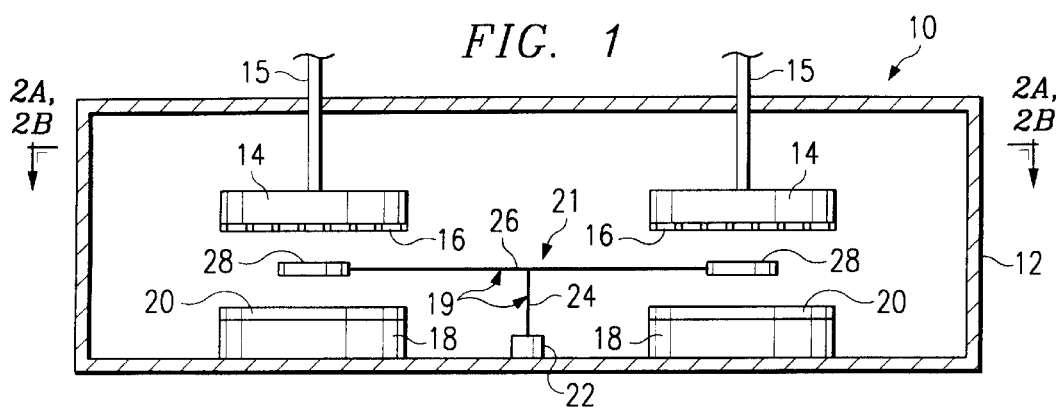
FIG. 1 is a schematic diagram showing a cross section of a semiconductor processing apparatus incorporating teachings of the present invention.

FIG. 1 is a schematic diagram showing a cross section of a semiconductor processing apparatus indicated generally at 10 incorporating teachings of the present invention. Semiconductor processing apparatus 10 includes substrate supports 18 disposed within process chamber 12 operable to support substrate wafers 20. Semiconductor processing apparatus 10 also includes showerhead assemblies 14. Showerhead assemblies 14 include showerhead plates 16 having a plurality of passageways 17 extending therethrough. Process fluid conduits 15 extend through process chamber 12 and are in fluid communication with showerhead assemblies 14 to communicate process fluid from the exterior of process chamber 12 into showerhead assemblies 14.

The present embodiment includes substrate supports 18, substrate wafers 20, showerhead assemblies 14 and process fluid conduits 15. In an alternative embodiment semiconductor processing apparatus may include a singular substrate support 18, substrate wafer 20 and showerhead assembly 14. Alternatively semiconductor processing apparatus 10 may include a plurality of substrate supports 18, substrate wafers 20 and showerhead assemblies 14.

Process fluid conduit 15 is operable to deliver process fluids from a process fluid source (not expressly shown) which may be externally located. Additionally, the process fluid source may include a control system for selectively controlling the flow rate of process fluid from the process fluid source to inlet conduit 15. Process fluid may include any process fluid suitable to be delivered through a showerhead assembly including process used in deposition processes and fluids used in etch processes.

Blocking assembly 21 is disposed within process chamber 12. Blocking assembly 21 includes rotator 22, rod assembly 24, arm assembly 26 and blocking disks 28. Rotator 22 is secured within process chamber 12. Rod assembly 24 is coupled to rotator 22 and extends from process chamber 12. In the present embodiment, rod assembly 24 extends substantially perpendicularly from process chamber 12. Arm assembly 26 is coupled to rod assembly 24 and extends from rod assembly 24. Blocking disks 28 are coupled to rod assembly 26 distal to rod assembly 24.

Rotator 22 is operable to selectively rotate. Rotator 22 may be operated mechanically or electrically. In this embodiment rotation of rotator 22 causes rod 24 to rotate about its longitudinal axis. In turn, rotation of rod assembly 24 causes arm assembly 26 and the disks 28 attached thereto to rotate through a horizontal plane through process chamber 12 such that the rotator is operable to selectively position blocking assembly 21 in an active position 32 (as described in FIG. 2B) and a neutral position 30 (as described in FIG. 2A).

In one embodiment rod assembly 24 may have a selectively variable length such that the rod assembly operates to selectively raise or lower blocking disk 28 relative to showerhead assembly 14. Rod assembly 24 may include a telescoping configuration operated pneumatically, mechanically, or electrically. In an alternative embodiment, rod assembly 24 may have another configuration suitable to selectively shorten or lengthen rod assembly 24.

Rod assembly 24 and arm assembly 26 form linkage 19. In this embodiment linkage 19 has a T-shaped configuration. In an alternative embodiment linkage 19 may have any suitable configuration wherein a first end of linkage 19 is coupled to rotator 22 and a second end of linkage 19 is coupled to blocking disk 28. In yet another alternative embodiment linkage 19 includes the first end coupled to rotator 22 and a plurality of ends wherein the plurality of blocking disks 28 are coupled. In an alternative embodiment linkage 19 may have any suitable configuration to link blocking disk 28 to rotator 22 such that rotation of rotator 22 selectively positions blocking disk 28 in active position 32 as described in FIG. 2B and in neutral position 30 as described in FIG. 2A.

In the present embodiment blocking disk 28 has an outer diameter smaller than the outer diameter of substrate wafer 20 and has a smaller diameter than the outer diameter of shower plate 16. In the present embodiment blocking disk 28 has a substantially circular configuration. In an alternative embodiment, blocking disk 28 may have other configurations as desired to selectively restrict process fluid flow from showerhead assembly 14 to substrate wafer 20.

In operation process fluid is communicated through process fluid conduit 15 to showerhead assembly 14. Process fluid exits showerhead assemblies 14 through passageways 17 in showerhead plate 16. Blocking assembly 21 may then be selectively positioned in active position 32 or neutral position 30. When positioned in neutral position 30, blocking assembly 21 does not restrict the flow of process fluid from showerhead assembly 14 to blocking disk 28. When blocking assembly 21 is positioned in active position 32, blocking disk 28 acts to partially restrict the flow of process fluid exiting passageways 17 towards substrate wafer 20. Because blocking disk 28 has an outer diameter smaller than the outer diameter of substrate wafer 20 and because active position 32 places blocking disk 28 above the center of substrate wafer 20, the flow of process fluid towards the center of substrate wafer 20 is substantially restricted. The flow of process fluid to a portion of the substrate wafer adjacent to the center portion of the substrate wafer is substantially unrestricted. In one embodiment of the present invention rod assembly 24 may be selectively shortened or lengthened such that the height of blocking disks 28 relative to substrate wafer 20 may be selectively increased or decreased. When blocking assembly 21 is in the active position, raising or lowering the height of blocking disk 28 relative to substrate wafer 20 affects the fabrication of the semiconductor device on substrate wafer 20.

In yet another embodiment of the present invention blocking disk 28 may be releasably coupled to blocking assembly 21. In another embodiment of the present invention blocking assembly 21 includes a plurality of blocking disks 28 having multiple disk sizes. This plurality of blocking disks 28 may be releasably coupled to arm assembly 26.

Figures 2A, 2B:
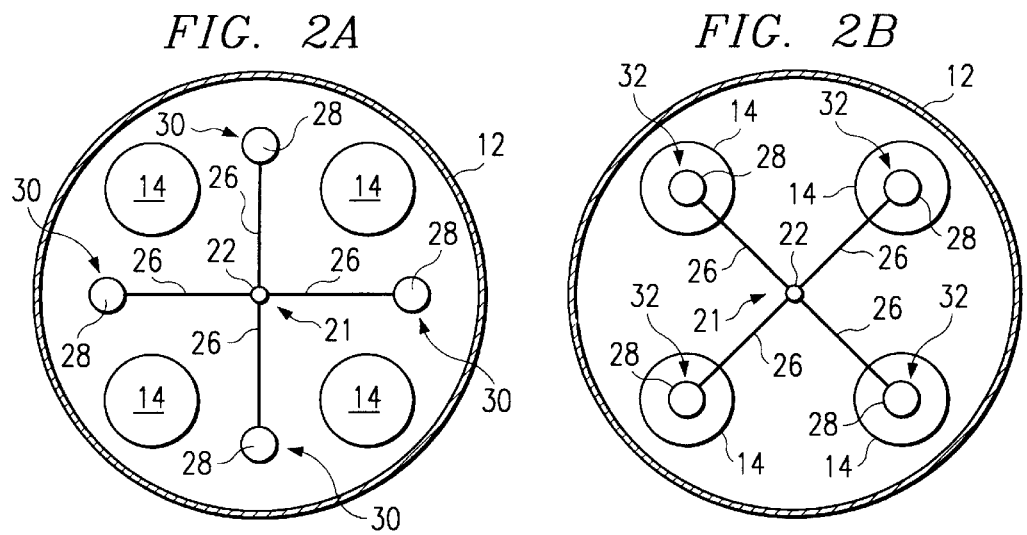
FIG. 2A is a schematic diagram showing a plan view of the semiconductor processing apparatus of FIG. 1 with a blocking assembly positioned in a neutral position according to teachings of the present invention.
FIG. 2B is a schematic diagram showing a plan view of the semiconductor processing apparatus of FIG. 1 with the blocking assembly positioned in an active position according to teachings of the present invention.

FIG. 2A is a schematic diagram showing a plan view of the semiconductor processing apparatus of FIG. 1 with a blocking assembly 21 positioned in a neutral position 30 according to the teachings of the present invention. The semiconducting processing apparatus includes a plurality of showerhead assemblies 14 and a blocking assembly 21 disposed within process chamber 12. Blocking assembly 21 includes rotator 22, rod assembly 24 coupled to rotator assembly 22, and arm assembly 26 coupled to rod assembly 24. Blocking disks 28 are coupled to arm assembly 26 extending from rod assembly 24.

In the present embodiment blocking assembly 21 is positioned in neutral position 30 such that blocking disks 28 do not restrict the flow of process fluid exiting passageways 15 and directed towards substrate wafers 20 (as shown in FIG. 1).

FIG. 2B is a schematic diagram showing a plan view of the semiconductor processing apparatus of FIG. 1 with the blocking assembly 21 positioned in active position 32 according to teachings of present invention. When positioned in the active position 32 blocking disks 28 are positioned to restrict the flow of process fluid exiting showerheads 14 directed towards substrate wafers 20 (as shown in FIG. 1).

Figure 3:
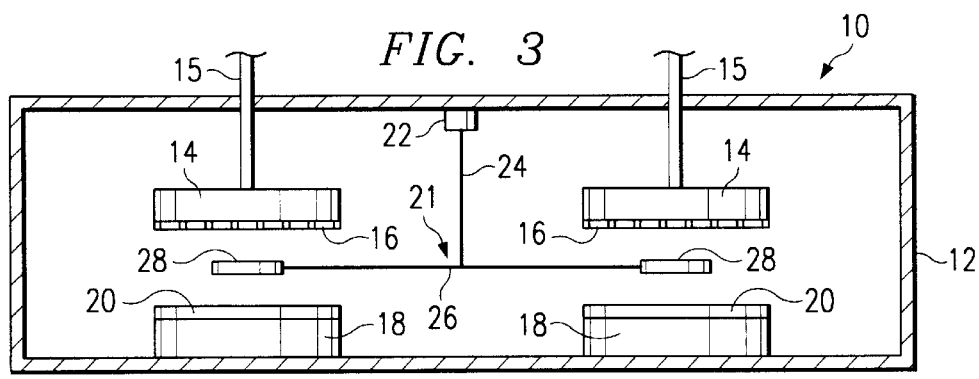
FIG. 3 is a schematic cross section diagram with portions broken away of a semiconductor processing apparatus with a blocking assembly depending from a top portion of the process chamber according to teachings of the present invention.

FIG. 3 is a schematic diagram of a semiconductor processing apparatus 10a with blocking assembly 21 depending from a top portion of process chamber 12 according to teachings of the present invention. Substrate supports 18 support substrate wafers 20 disposed within process chamber 12. Showerhead assemblies 14 including showerhead plates 16 with plurality of passageways 17 extending therethrough, are disposed in process chamber 12 facing substrate supports 18. Process fluid inlets 15 are in fluid communication with showerhead assemblies 14 such that process fluids communicate through process fluid inlets 15 to showerhead assemblies 14 and exit showerhead assemblies 14 through passageways 17. Blocking assembly 21 is disposed within process chamber 12 such that blocking assembly depends from a top portion of process chamber 12. Blocking assembly 21 includes rotator 22, rod assembly 24 coupled to rotator 22, and arm assembly 26 coupled to rod assembly 24. Blocking disks 28 are coupled to arm assembly 26.

Figure 4:
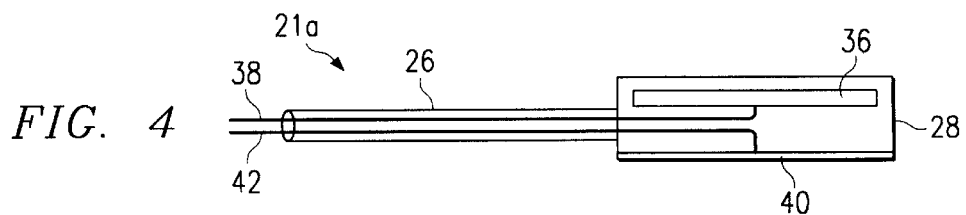
FIG. 4 is a schematic diagram of a portion of a blocking assembly with a heating element and electrode disposed within the blocking assembly according to teachings of the present invention.

FIG. 4 is a schematic diagram of a portion of a blocking assembly 21a with a heating element 36 and an electrode 40 disposed within the blocking assembly according to teachings of the present invention. The portion of blocking assembly 21a includes blocking disk 28 coupled to arm assembly 26. Heating element 36 is disposed within blocking disk 28a and is in electrical communication with a heating element power supply (not expressly shown) via heating element connection 38. Electrode 40 is disposed within blocking disk 28a. Electrode 40 is in electrical communication with an electrode power supply (not expressly shown) via electrode connection 42. In an alternative embodiment, in which blocking disk 28a is releasably coupled to arm assembly 26, releasable connectors allow for the releasable connection between heating element 36 and heating element connection 38 and electrode 40 and electrode connection 42.

In operation power from the heating element power supply may be selectively delivered to heating element 36 such that heating element 36 will selectively effect the temperature within process chamber 12. Such heating effects include altering process fluid flow and deposition characteristics within the chamber. Power may also be supplied from the electrode power supply to electrode 40 via electrode connection 42 such that electrode 40 creates a plasma field as process fluid exits showerhead assembly 14. The localized plasma field effect from electrode 40 may selectively effect process fluid flow and deposition characteristics within the process chamber 12. In an alternative embodiment blocking assembly 21a may include either heating element 36 and heating element connection 38 or electrode 40 and electrode connection 42. In operation power may be supplied to heating element 36 such that the temperature of blocking disk 28a increases. Power may be supplied to heating element 36 when blocking assembly 21a is either in active position 32 (as shown in FIG. 2B) or neutral position 30 (as shown in FIG. 2A).

Power may be supplied to heating element 36 while blocking assembly 21a is in neutral position 30 for a predetermined period or until heating element 36 reaches a desired temperature. Blocking assembly may then be positioned in active position 32 for restricting the flow of process fluid exiting showerhead assembly 14. Power may continue to be supplied to heating element 36 or may be reduced or discontinued after blocking disk 28a reaches a predetermined temperature. In an alternative embodiment a temperature sensor is disposed within blocking assembly 21a for determining the temperature of blocking assembly 21a.

Power may be supplied to electrode 40 when blocking assembly 21a is either in active position 32 (as shown in FIG. 2B) or neutral position 30 (as shown in FIG. 2A). Power may be supplied to electrode 40 while blocking assembly 21a is in neutral position 30 and then moved into active position 32. Alternatively, power may be initially supplied to electrode 40 when blocking assembly 40 is in active position 30. Power may continue to be supplied to electrode 40 for an entire processing step or may be increased, decreased or discontinued after a predetermined period.

Power may be supplied to heating element 36 and electrode 40 simultaneously. Alternatively, power may be supplied to heating element 36 and electrode 40 independently.

Although the disclosed embodiments have been described in detail, it should be understood that various changes, substitutions and alterations can be made to the embodiments without departing from their spirit and scope.

What is claimed is:

1. A method for fabricating a semiconductor device on a substrate wafer disposed in a semiconductor fabrication apparatus comprising:

supplying process fluid to a showerhead assembly positioned opposite the substrate wafer; and selectively positioning a blocking assembly between the showerhead assembly and the substrate wafer to restrict the flow of process fluid from the showerhead assembly to the substrate wafer, thereby affecting the fabrication of the semiconductor device.

2. The method of claim 1 further comprising moving the blocking assembly to a position restricting the flow of process fluid between the showerhead assembly and the substrate wafer.

3. The method of claim 1 further comprising selectively varying the height of the blocking assembly between the showerhead assembly and the semiconductor assembly.

4. The method of claim 1 further comprising selectively varying power to an electrode forming a portion of the blocking assembly.

5. The method of claim 1 further comprising selectively varying the power supplied to a heating element disposed within the blocking assembly.

6. The method of claim 1 further comprising the process fluid depositing a material on the substrate wafer.

7. The method of claim 1 further comprising the process fluid etching a portion of the substrate wafer.

* * * * *